United States Patent [19]

Toda

[11] Patent Number: 5,249,165
[45] Date of Patent: Sep. 28, 1993

[54] MEMORY CELL ARRAY DIVIDED TYPE MULTI-PORT SEMICONDUCTOR MEMORY DEVICE

[75] Inventor: Haruki Toda, Yokohama, Japan

[73] Assignee: Kabushiki Kaisha Toshiba, Kawasaki, Japan

[21] Appl. No.: 846,913

[22] Filed: Mar. 6, 1992

[51] Int. Cl.$^5$ .............................................. G11C 13/00
[52] U.S. Cl. ........................ 365/189.04; 365/189.01; 365/230.05
[58] Field of Search ...................... 365/189.01, 189.04, 365/230.05

[56] References Cited

U.S. PATENT DOCUMENTS 4,569,036 2/1986 Fujii et al. ........................... 365/230
4,937,788 6/1990 Harada ............................ 365/189.04
5,177,706 1/1993 Shinohara ......................... 365/189.04

FOREIGN PATENT DOCUMENTS 1-241093 9/1989 Japan .

Primary Examiner—Terrell W. Fears
Attorney, Agent, or Firm—Foley & Lardner

[57] ABSTRACT

A memory cell array divided type multi-port memory device having random access circuit and serial access circuit, including: a plurality of cell array sections each having a plurality of memory cells disposed in a matrix form, the plurality of cell array sections being disposed in a column direction at a predetermined pitch, each the cell array section having a plurality of word lines and bit lines, the word lines being connected to the memory cells disposed in a row direction for selection of the connected memory cells, and the bit lines being connected to the memory cells disposed in a column direction for data transfer to and from the selected memory cells; a row decoder for activating a desired one of the word lines; sense amplifier provided for each the bit line for sensing data read out to each the bit line; a RAM port connected to the bit lines via RAM transfer gates; a column decoder for selectively turn on/off the RAM transfer gates; a plurality of data transfer lines each having a data transfer gate at the intermediate position thereof, the data transfer lines being connected to the bit lines and formed on a layer different from layers of the word lines and bit lines; data transfer gate control means for turning on/off a desired one of the data transfer gates; a plurality of serial resisters connected to the data transfer lines; a serial port connected via each serial transfer gate to each the serial register; and a serial decoder for serially turning on/off the serial transfer gates.

23 Claims, 12 Drawing Sheets

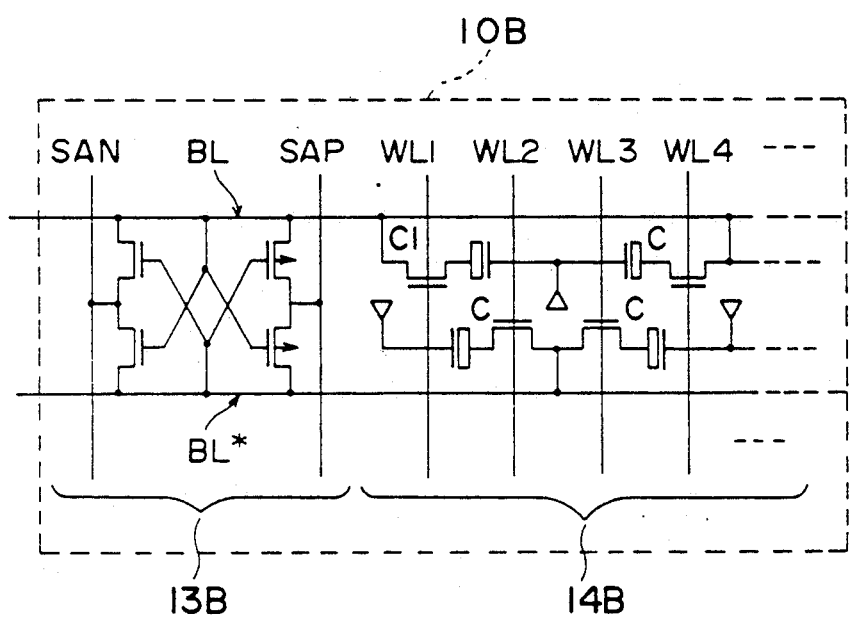
F I G. 5A

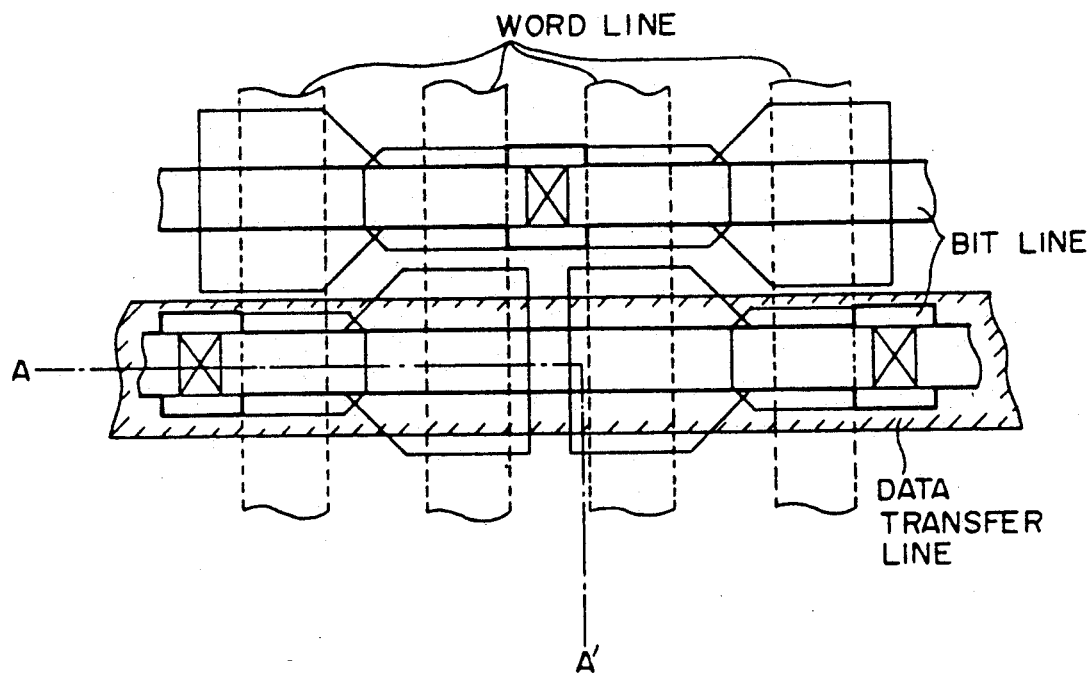
FIG. IIA
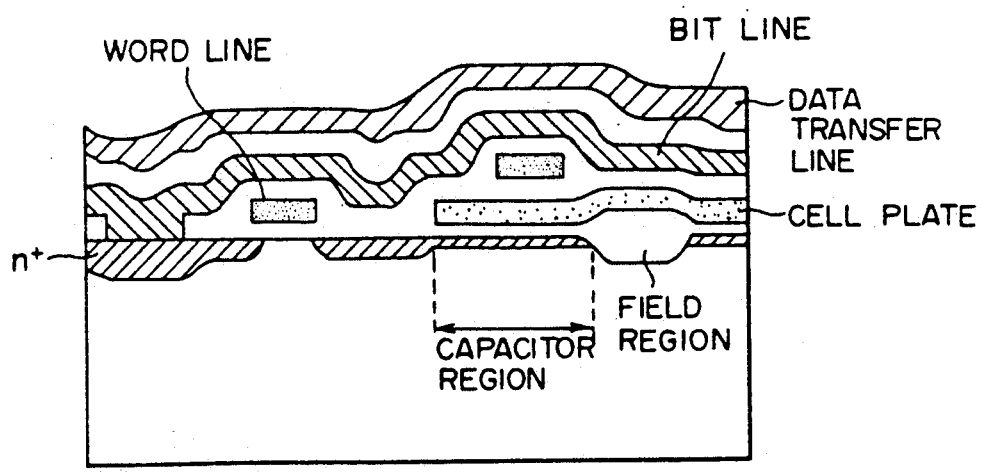
FIG. IIB

MEMORY CELL ARRAY DIVIDED TYPE MULTI-PORT SEMICONDUCTOR MEMORY DEVICE

FIELD OF THE INVENTION

The present invention relates to a memory cell array divided type semiconductor memory device, and more particularly to a memory cell array divided type multi-port semiconductor memory device suitable for use as a multi-port memory having a dynamic memory cell array and a serial access memory having a data transfer function.

BACKGROUND OF THE INVENTION

A memory having a large capacity serial access memory unit is known used as a memory device (semiconductor memory device) for reading image data to be transmitted to a graphics equipment such as a CRT and for writing processed image data. One of such memories is a dual port video RAM. This RAM has a dynamic random access memory (DRAM) unit and a serial access memory (SAM) unit both of which can be accessed asynchronously.

FIG. 1 is a schematic diagram showing such a conventional memory device (dual port video RAM). As shown in FIG. 1, this memory device has a RAM unit 10 and a SAM unit 11. The RAM unit 10 has a cell array 14 made of capacitors and transistors, sense amplifiers 13 for amplifying data of a cell selected from the cell array 14, and a column decoder 12 for connecting a selected one of the sense amplifiers 13 to a data output path. The SAM unit 11 has serial registers 15 for one-dimensionally holding a set of serially accessed data, and serial decoders 16 for sequentially accessing the serial registers. Although not shown in FIG. 1, the cell array 14 has a row decoder for selecting one of word lines. In the RAM and SAM units 10 and 11, data in a plurality of cells connected to one word line (not shown) sensed by the RAM unit 10 is transferred by a transfer gate TRG. When any one of word lines of the RAM unit 10 is accessed, data on the line can be transferred to the SAM unit 11.

FIG. 2 is a circuit diagram showing the details of a circuit portion of FIG. 1 corresponding to one bit. As shown in FIG. 2, one of word lines WL1, WL2, . . . is selected for reading data from the cell array 14. Data in the cell array 14 is outputted to bit lines BL/BL*. At the sense amplifier 13, control lines SAN/SAP are controlled to guide the data on data lines DQ/DQ*. The cell array 14 is connected to the SAM unit 11 via the transfer gates TRG. After the data on the bit lines BL/BL* is established, the transfer gate TRG is turned on so that the data is transferred to nodes RN/RN* of the SAM unit 11. Then, the data is read onto serial data lines SQ/SQ*.

The operation of the memory device will further be described. Consider that one of word lines WL1, WL2, . . . is selected by a row decoder (not shown). Data on a cell C1 is outputted to the bit line BL. The bit lines BL/BL* are being set to an intermediate level before data access. Therefore, the level of the bit line BL* is at a reference level. The levels at the bit lines BL/BL* are sensed and amplified by the sense amplifier 13, as the level at the control line SAN goes toward $V_{ss}$ and the level at the control line SAP goes toward $V_{cc}$. One of the levels at the bit lines BL/BL* is therefore set to "1" and the other is set to "0." Under this condition, when the gate G1 of the column decoder 12 turns on, the data is outputted from the RAM unit 10 via the complementary data lines DQ/DQ*. After the data on the bit lines BL/BL* is established and the transfer gate TRG rises, the data is transferred to the serial register of the SAM unit 11. When the transfer gate TRG falls, the data is held. Thereafter, when the gate G2 is turned on by the serial decoder 16, the data is serially outputted from the SAM unit 11 via the serial data lines SQ/SQ*.

With the memory device constructed as above, as the capacity of the RAM unit 10 increases, the number of at least ones of word lines WL1, WL2, . . . and bit lines BL/BL* increases. As the number of cells of the cell array 14 connected to the word lines WL1, WL2, . . . and bit lines BL/BL* increases, current for charging/discharging one of sense amplifiers 13 also increases, in addition to an increased number of sense amplifiers 13. From this reason, consumption current per one sense operation by the RAM unit 10 increases. A number of such memory devices (video RAMs) constructed as above are used on one system. These memory devices are often activated at the same time. As a result, an increase in operation current is considerably great.

An example of conventional memory devices constructed while taking into consideration of the above circumstances is shown in FIG. 3. As shown in FIG. 3, RAM units 10A and 10B are connected to a SAM unit 11 via transfer gates TRG1 and TRG2. The RAM unit 10A is constructed of a cell array 14A, sense amplifiers 13A, and column decoders 12A. The RAM unit 10B is constructed of a cell array 14B, sense amplifiers 13B, and column decoders 12B. In contrast with the structure shown in FIG. 1, the RAM unit 10 of FIG. 1 is divided into the two RAM units 10A and 10B disposed on opposite sides of the SAM unit 11.

With such an arrangement, the length of a bit line is reduced by a half. Also, a charge/discharge current per one sense amplifier is reduced by a half. Namely, a sense operation is performed only for the circuit portion belonging to an accessed word line in the RAM unit 10A or 10B. Therefore, as compared with the device shown in FIG. 1, the total current of the RAM units 10A and 10B is halved. However, the RAM units 10A and 10B are required to have their own independent sense amplifiers 13A and 13B and column decoders 12A and 12B.

FIG. 4 is a circuit diagram showing the details of a circuit portion corresponding to one column of the SAM unit shown in FIG. 3. As shown in FIG. 4, the number of cells connected to bit lines is halved. The bit lines of the RAM units 10A and 10B are connected via the transfer gates TRG1 and TRG2 to serial nodes RN/RN* of the serial registers 15 of the SAM unit 11. It is important that the bit lines of the RAM units 10A and 10B belonging to the same column are connected together at the SAM unit 11. With this arrangement, it is possible for the single SAM unit 11 to read and write data from and to cells belonging to a desired word line of either the RAM unit 10A or 10B. Similar to the case of FIGS. 1 and 2, the serial decoder 16 allows serial access to the serial registers 15. It is obvious that data transfer between the RAM units 10A and 10B and the SAM unit 11 is performed when one of the transfer gates TRG1 and TRG2 on the side of data transfer is turned on.

The structure of a conventional memory device fabricated on an integrated semiconductor circuit will be discussed. Such a device requires two types of low resistance wiring materials. One wiring material is used for forming data transfer lines including word lines WL1, WL2, . . . data lines DQ/DQ*, and signal lines to the column decoder 12 and serial decoder 16. The other wiring material is used for forming bit lines, and lines (nodes RN/RN*) interconnecting the bit lines of the RAM units 10A and 10B via the serial registers 15. As these wiring materials, metal silicide (sheet resistance several ohms/□) is practically used for lines associated with the bit lines, and Al (sheet resistance up to 50 milli-ohms/□) is used for lines associated with word lines. Lines of these two different wiring materials cannot be intersected on an integrated semiconductor integrated circuit unless they are formed on two different layers.

As discussed above, a conventional memory device can reduce an operation current by dividing a RAM into two RAM sections. However, if the capacity of memory increases, power consumption cannot be reduced further unless the RAM is divided into a larger number of RAM sections. In such a case, however, in order for a single RAM to read and write data from and to cells belonging to an optional word line of the RAM, all RAM sections are required to be connected to the single SAM unit. However, in practice, the RAM cannot be divided into more than two RAM sections as was conventional, because bit lines are required to be extended to and connected to transfer gates.

SUMMARY OF THE INVENTION

The present invention has been made in consideration of the above-described circumstances. It is an object of the present invention to provide a semiconductor memory device having a construction allowing its memory cell array to be divided into a plurality of cell array sections to be connected to a common SAM unit (serial port) for the reduction of power consumption.

A memory cell array is divided into a plurality (e.g., three) of cell array sections. Each cell array section is connected to the serial port via data transfer gates. Partial cell array sections and data transfer gates are selectively activated so that the memory device can operate with low power consumption. Data transfer lines interconnecting a plurality of cell array sections and the serial port are formed on a layer three-dimensionally different from layers formed with word lines and bit lines. In this manner, it becomes possible to connect three or more cell array sections to a single serial port, while increasing the capacity of memory and reducing power consumption.

As described above, according to the present invention, with a simple circuit structure adding only one low resistance wiring material layer, it is possible to increase the number of divided memory cell sections connected to a single serial port, and to realize low power consumption and large capacity of memory devices to be used as video RAMs or the like of large capacity and high speed operation.

BRIEF DESCRIPTION OF THE DRAWINGS

FIG. 5A is a circuit diagram showing a memory cell array and sense amplifier of the memory device shown in FIG. 5 corresponding to one bit.

FIGS. 11A and 11B are plane view and cross sectional view thereof showing connection lines of one embodiment.

DESCRIPTION OF THE PREFERRED EMBODIMENTS

Embodiments of the present invention will be described with reference to the accompanying drawings.

Figure 5:
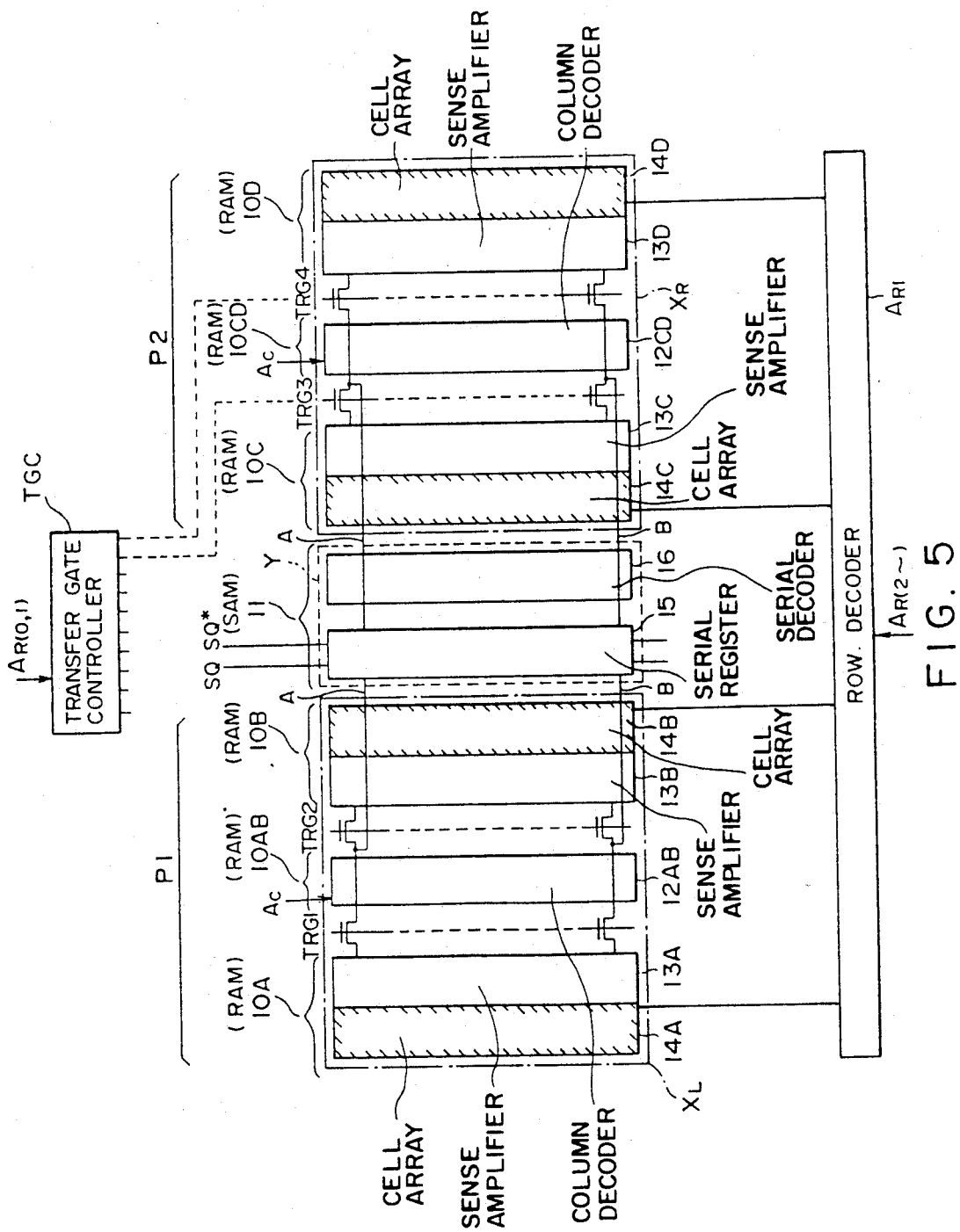
FIG. 5 is a schematic diagram showing an embodiment of a memory device according to the present invention.

FIG. 5 shows a memory device according to an embodiment of the present invention. In this embodiment, a RAM cell array is divided into four RAM sections, and the device has two low resistance connection lines WLL and BLL respectively associated with word lines and bit lines, as well as one low resistance connection lines DLLL. One example of the connection lines is shown in FIGS. 11A and 11B. FIG. 11A is a plane view, and FIG. 11B is a cross sectional view taken along line X—X of FIG. 11A.

As shown in FIG. 5, the memory device of this embodiment has four cell arrays 14A, 14B, 14C, and 14D. These arrays 14A to 14D have sense amplifiers 13A, 13B, 13C, and 13D, respectively, to constitute RAM sections 10A, 10B, 10C, and 10D. A common RAM section 10AB (column decoder 10) is provided between the RAM sections 10A and 10B, and another common RAM section CD (column decoder 12AB) is provided between the RAM sections 10C and 10D. The RAM section 10A is connected to a SAM unit 11 via transfer gates TRG1 and nodes A and B. The RAM section 10B is connected to the SAM unit 11 via transfer gates TRG2 and the nodes A and B. The RAM section 10C is connected to the SAM unit 11 via transfer gates TRG3 and the nodes A and B. The RAM section 10D is connected to the SAM unit 11 via transfer gates TRG4 and the nodes A and B. Serial registers of the SAM unit 11 are accessed by serial decoders to read and write data via serial data lines SQ/SQ*.

One word line in one of cell arrays 14A to 14D is activated by a row decoder RD which decodes row addresses. Only a transfer gate between the activated word line and a serial register 15 is turned on by a transfer gate controller TGC which decodes row address $A_{R0}$ and $A_{R1}$, for example.

Figure 6:
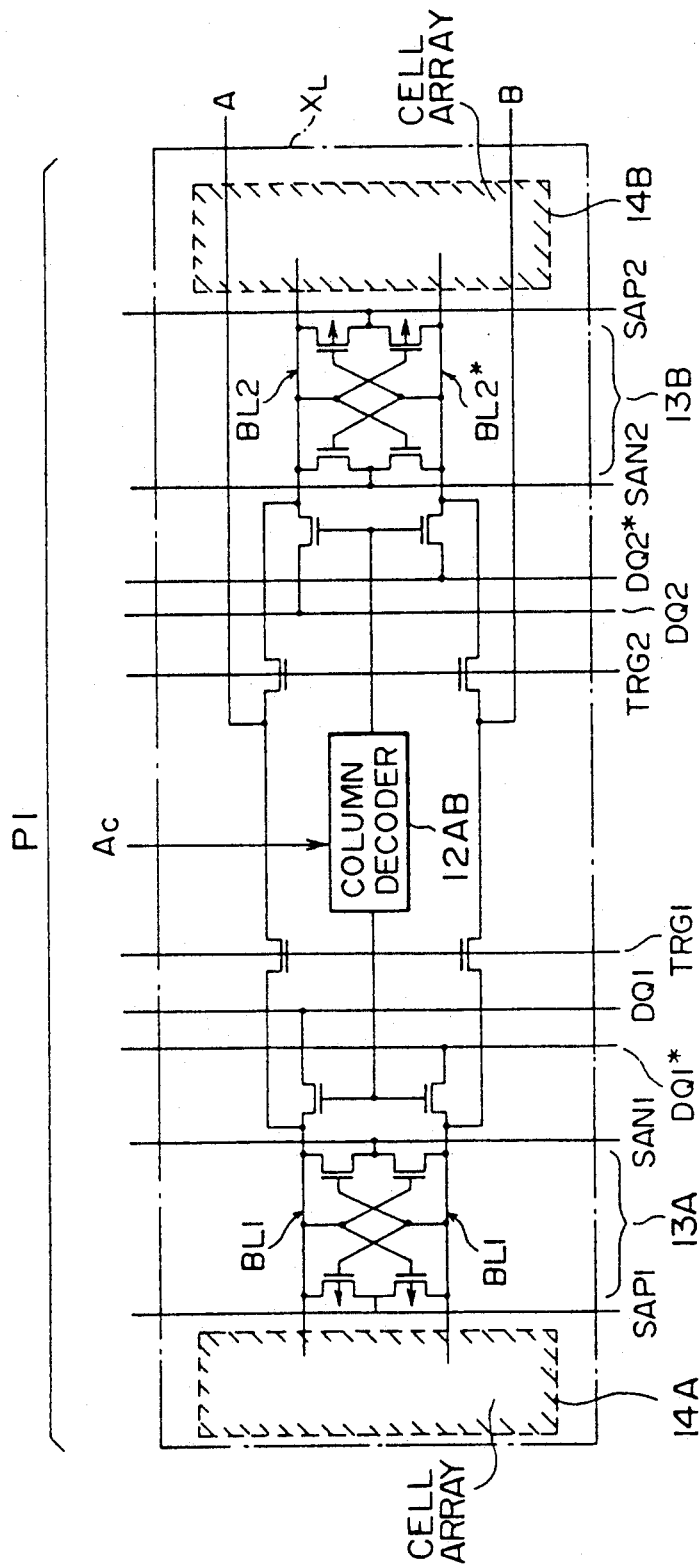
FIG. 6 is a detailed circuit diagram showing part of the memory device shown in FIG. 5 corresponding to one bit.

FIG. 6 is a detailed circuit diagram corresponding to one bit of the RAM sections 10A and 10B and the column decoder 10AB at the circuit portion indicated at P1 in FIG. 5. The sense amplifier 13A is connected to the cell array 14A via bit lines BL1/BL1*. The sense amplifier 13A is activated by control lines SAN1/SAP1, to establish the level of data in a selected cell of the cell array 14A. Data at the sense amplifier 13A is read and written relative to data lines DQ1/DQ1* using the column decoder 12AB. The sense amplifier 13B is connected to the cell array 14B via bit lines BL2/BL2*. The sense amplifier 13B is activated by control lines SAN2/SAP2, to establish the level of data in a selected cell of the cell array 14B. Data at the sense amplifier 13B is read and written relative to data lines DQ2/DQ2* using the column decoder 12AB. The data at the sense amplifier 13A is transferred to common nodes A and B via transfer gates TRG1. The data at the sense amplifier 13B is transferred to the common nodes A and B via transfer gates TRG2. The nodes A and B are connected to the serial register 15 of the SAM unit 11 as seen from FIG. 5.

FIG. 5A is a detailed circuit diagram of the sense amplifier 13B and cell array 14B of the RAM section 10B corresponding to one bit.

Figure 7:
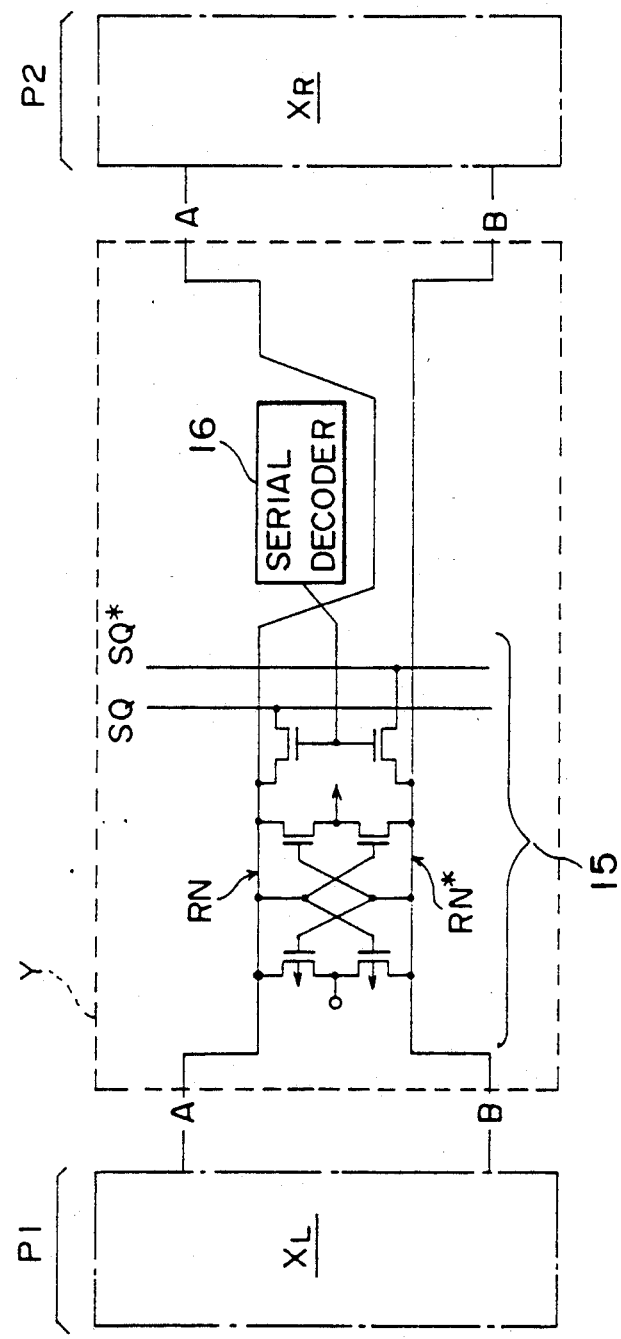
FIG. 7 is a detailed circuit diagram showing part of the SAM unit shown in FIG. 5 corresponding to one column.

FIG. 7 is a detailed circuit diagram of the SAM unit of FIG. 5 corresponding to one bit. As shown in FIG. 7, the nodes A and B are connected to nodes RN/RN* of the serial register 15. When one of the transfer gates TRG1 to TRG4 shown in FIG. 5 is selected, the data in the corresponding one of the sense amplifiers 13A to 13D is transferred to the serial register 15 via the nodes A and B. The data in the serial register 15 is serially read to the serial data lines SQ/SQ* using the serial decoder 16.

Figure 1:
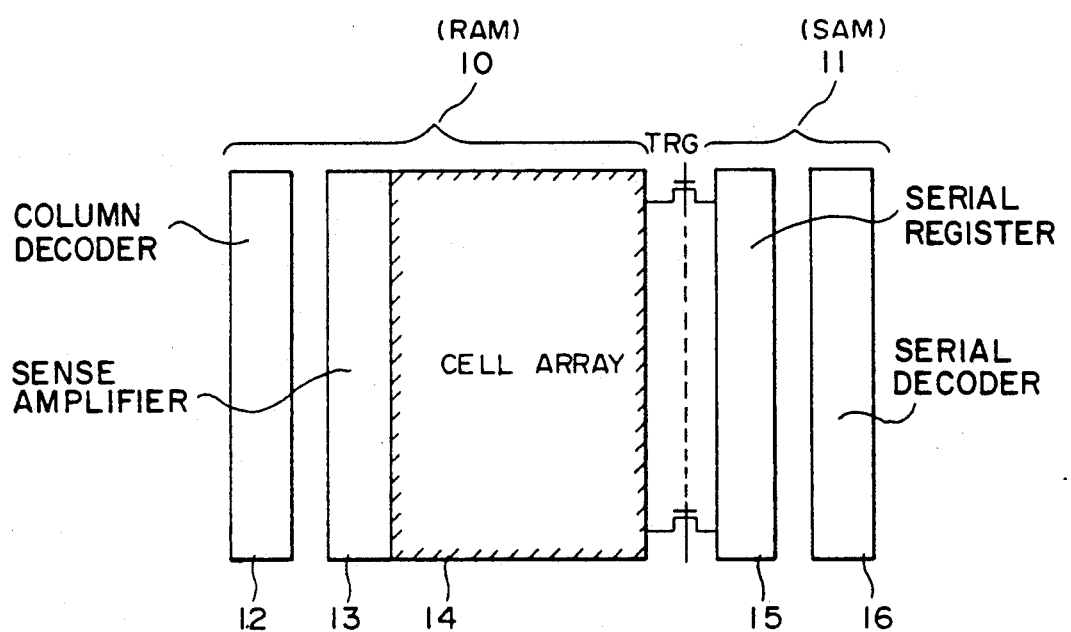
FIG. 1 is a schematic diagram showing an example of conventional memory devices.
Figure 2:
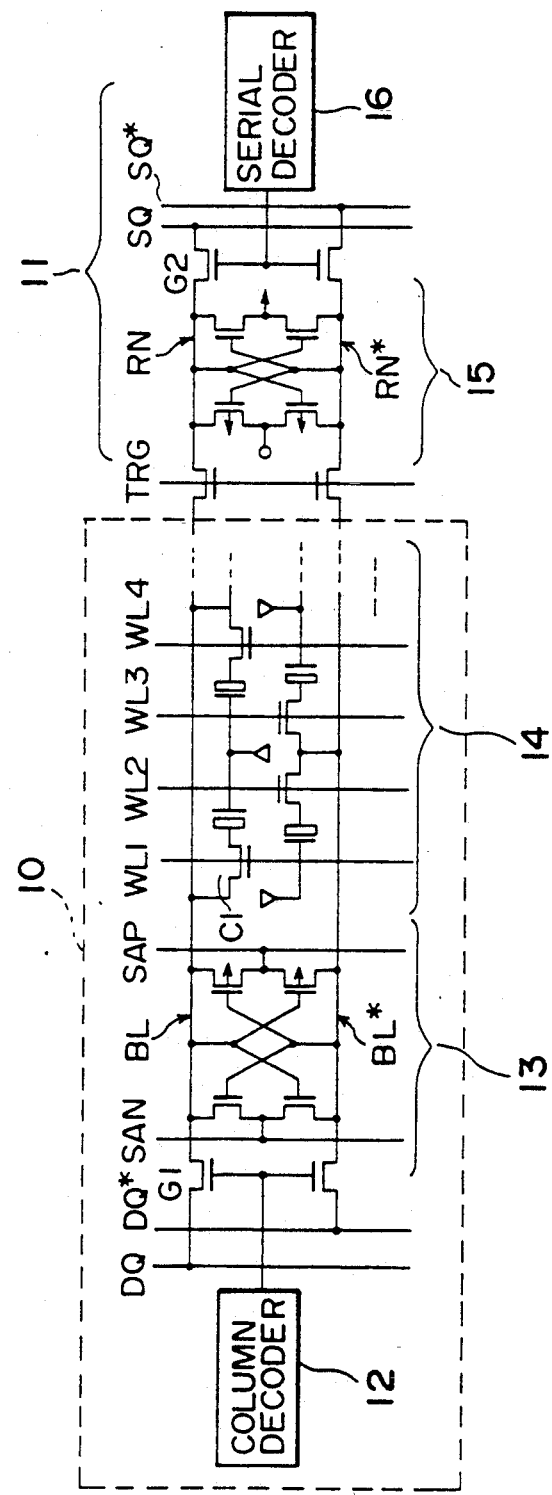
FIG. 2 is a detailed circuit diagram showing part of the circuit shown in FIG. 1 corresponding to one bit.
Figure 3:
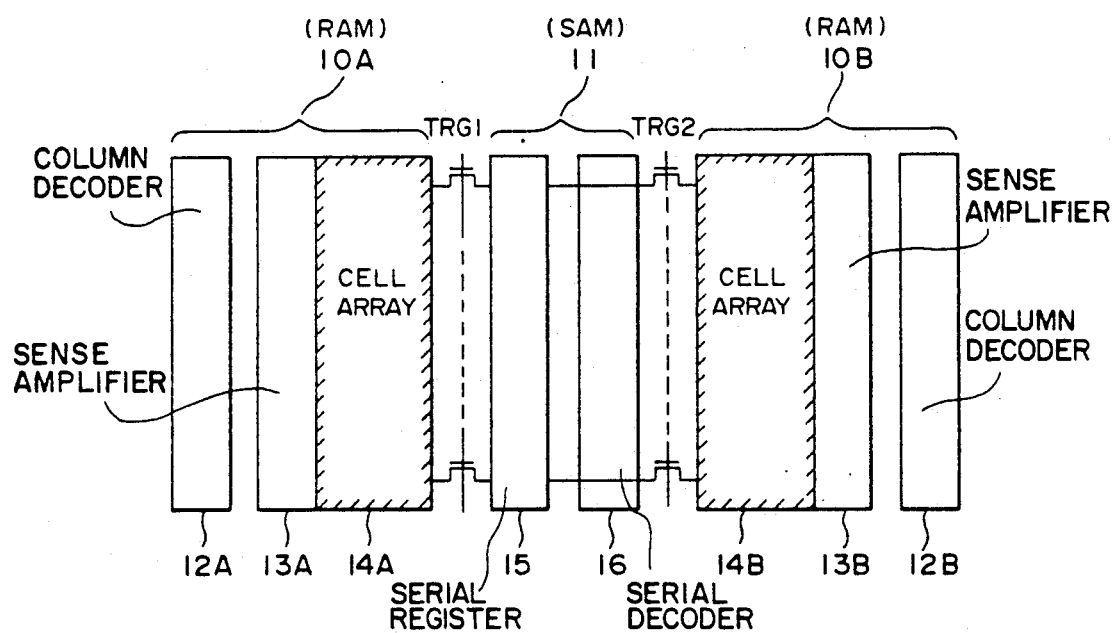
FIG. 3 is a schematic diagram showing another example of conventional memory devices.
Figure 4:
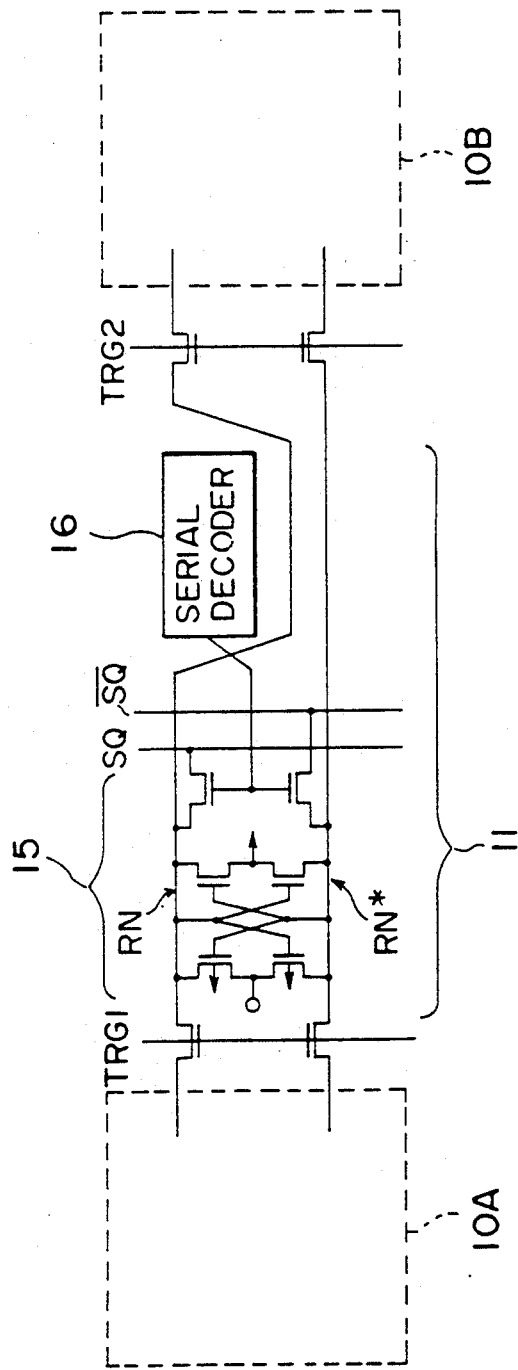
FIG. 4 is a detailed circuit diagram showing part of the SAM unit shown in FIG. 3 corresponding to one column.

The memory device described above and shown in FIG. 5 is assumed to have the total memory capacity same as the device shown in FIG. 1. In this case, the capacitance at each bit line of each cell array 14A to 14D is reduced by one-fourth. The number of sense amplifiers 13A to 13D are increased by four times. However, only one of the sense amplifiers 13A to 13D operates, corresponding to the case where only one of the sense amplifiers is used. The number of word lines connected to each cell array 14A to 14D is reduced, and the number of cells connected to one sense amplifier is also reduced. Therefore, an operation current necessary for one data access is considerably reduced. The common RAM sections 10AB and 10CD are connected between the RAM sections 10A and 10B and between the RAM sections 10C and 10D, respectively. Data transfer between the RAM sections 10A to 10D and the SAM unit 11 is performed via one of the transfer gates TRG1 to TRG4 to the nodes A and B. The nodes A and B are formed on a different layer, using low resistance wiring material. When a cell in one of the cell arrays 14A to 14D is selected, the corresponding one of the sense amplifiers 13A to 13D is activated to establish the data for the cell. When one of the transfer gates TRG1 to TRG4 corresponding to the activated sense amplifier is selected, data is transferred via the common nodes A and B from one of the RAM sections 10A to 10D to the SAM unit 11, or vice versa.

As seen from FIGS. 6 and 7, connection lines of the common nodes A and B to the transfer gates TRG1 to TRG4 are formed on a different layer and with different material from those of the bit lines BL1/BL1*, BL2/BL2*, BL3/BL3*, . . . . The bit lines are connected to the transfer gates TRG1 to TRG4. The common nodes A and B are connected to the nodes RN/RN* at the SAM unit 11.

The memory device constructed as above can transfer data freely between a single SAM unit and a number of RAM sections. Furthermore, a RAM is divided into a number of partial RAM sections, so the power consumption can be greatly reduced during its operation.

Figure 8:
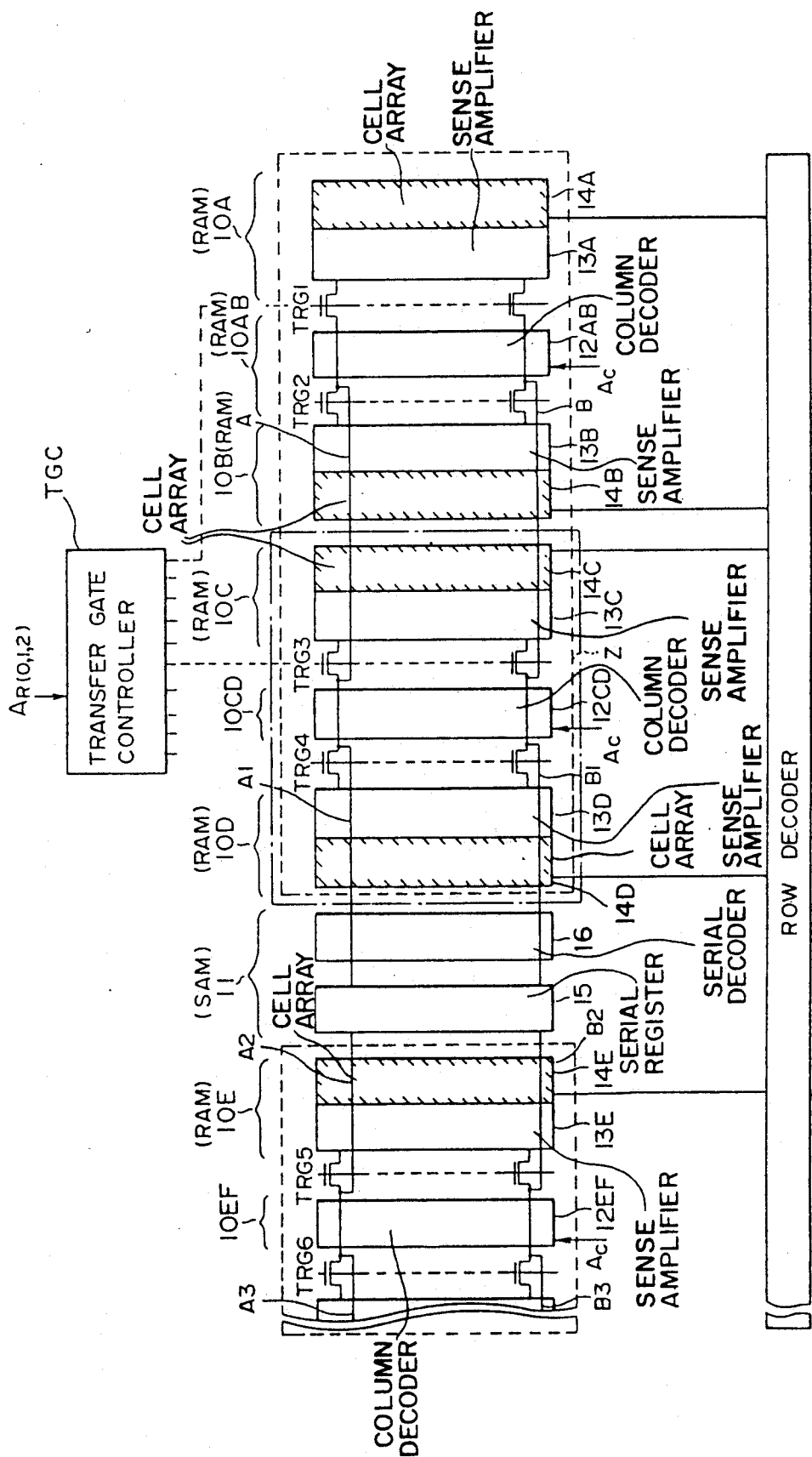
FIG. 8 is a schematic diagram showing another embodiment of the memory device according to the present invention.

The above embodiment shows division of a RAM unit into four RAM sections. The present invention is also applicable to division of a RAM unit into an optional number of RAM sections. For example, FIG. 8 shows an example of division of a RAM unit into eight RAM sections. As shown in FIG. 8, the memory device of this embodiment has eight cell arrays 14A, 14B, . . . and sense amplifiers 13A, 13B, . . . , to constitute RAM sections 10A, 10B, . . . . A common RAM section (column decoder 12AB) is provided between the RAM sections 10A and 10B. A common RAM section (column decoder 12CD) is provided between the RAM sections 10C and 10D. A common RAM section 10EF (column decoder 12EF) is provided between RAM sections 10E and 10F (not shown). The RAM section 10A is connected to a SAM unit 11 via the transfer gates TRG1 and common nodes A and B, and A1 and B1. The RAM section 10B is connected to the SAM unit 11 via the transfer gates TRG2 and the common nodes A and B, and A1 and B1. The RAM section 10C is connected to the SAM unit 11 via the transfer gates TRG3 and the common nodes A1 and B1. The RAM section 10D is connected to the SAM unit 11 via the transfer gates TRG4 and the common nodes A1 and B1. The RAM section 10E is connected to the SAM unit 11 via the transfer gates TRG5 and common nodes A2 and B2. Other connection relations not shown in FIG. 8 are similar to the above description. The serial register 15 of the SAM unit 11 is accessed using the serial decoder 16 to read/write data relative to the serial data lines.

Figure 9:
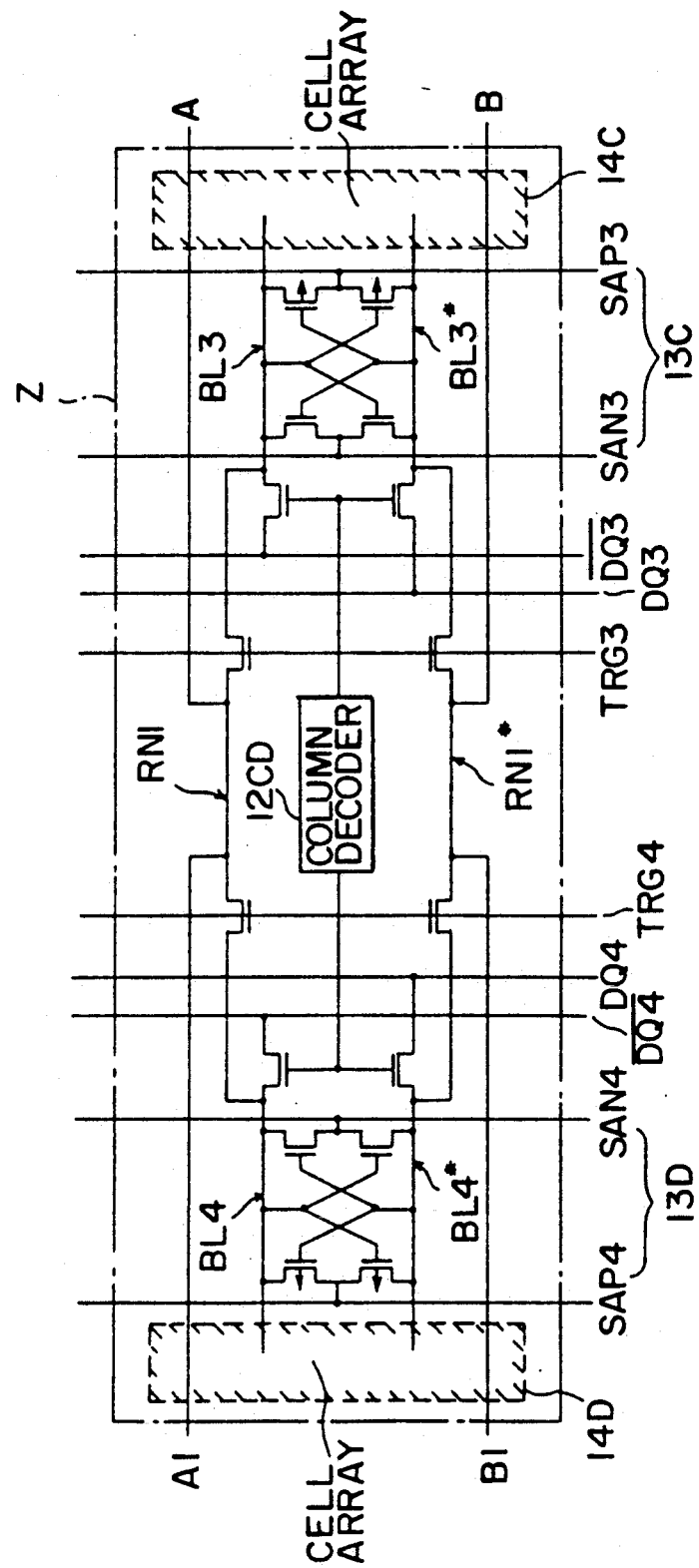
FIG. 9 is a detailed circuit diagram showing the structure of the memory device shown in FIG. 8 corresponding to one bit.

FIG. 9 is a detailed circuit diagram of the RAM sections 10C and 10D and column decoders shown in FIG. 8 corresponding to one bit. A sense amplifier 13C is connected to the cell array 14C via bit lines BL3/BL3*. The sense amplifier 13C establishes the level of data stored in a selected cell of the cell array 14C, under control by control lines SAN3/SAP3. The data at the sense amplifier 13C is read and written relative to data lines DQ3/DQ3* by using the column decoder 12CD. A sense amplifier 13D is connected to the cell array 14D via bit lines BL4/BL4*. The sense amplifier 13D establishes the level of data stored in a selected cell of the cell array 14D, under control by control lines SAN4/SAP4. The data at the sense amplifier 13D is read and written relative to data lines DQ4/DQ4* by using the column decoder 12CD. Data at a sense amplifier 13C is transferred to the common nodes A and B via the transfer gate TRG3. Data at the sense amplifier 13D is transferred to the common nodes A1 and B1 via the transfer gate TRG4. Nodes RN1/RN1* connect the nodes A and B and the nodes A1 and B1 together. As a result, data in the RAM sections 10C and 10D is transferred to the serial registers 15 of the SAM unit 11 via the common nodes A1 and B1, whereas data in the RAM sections 10A and 10B is transferred to the serial registers 15 of the SAM unit 11 via the common nodes A and B and via the common nodes A1 and B1. The above operation is the same for the circuit portion not shown in FIG. 9.

With the circuit arrangement shown in FIGS. 8 and 9, nodes A and B and following nodes are consecutively connected toward the SAM unit 11 to thereby allow the number of partial RAM sections to be increased to eight. Assuming that the capacity of one cell array is the same as that shown in FIG. 5, the memory capacity can be increased without changing power consumption.

As described above, with the embodiment structure of the present invention, assuming that the capacity of one cell array is the same as that of the cell array 14 of FIG. 1, the memory capacity can be increased without changing power consumption. Conversely, if M-divided cell arrays are used while setting the total capacity thereof same as that of the memory cell array 14 of FIG. 1, then power consumption can be reduced one/M-th of the cell array 14 of FIG. 1.

In the above embodiments, the SAM unit is disposed at the center of a plurality of RAM sections. Instead, it may be disposed at one opposite end portion of a plurality of divided RAM sections disposed laterally.

Figure 10A:
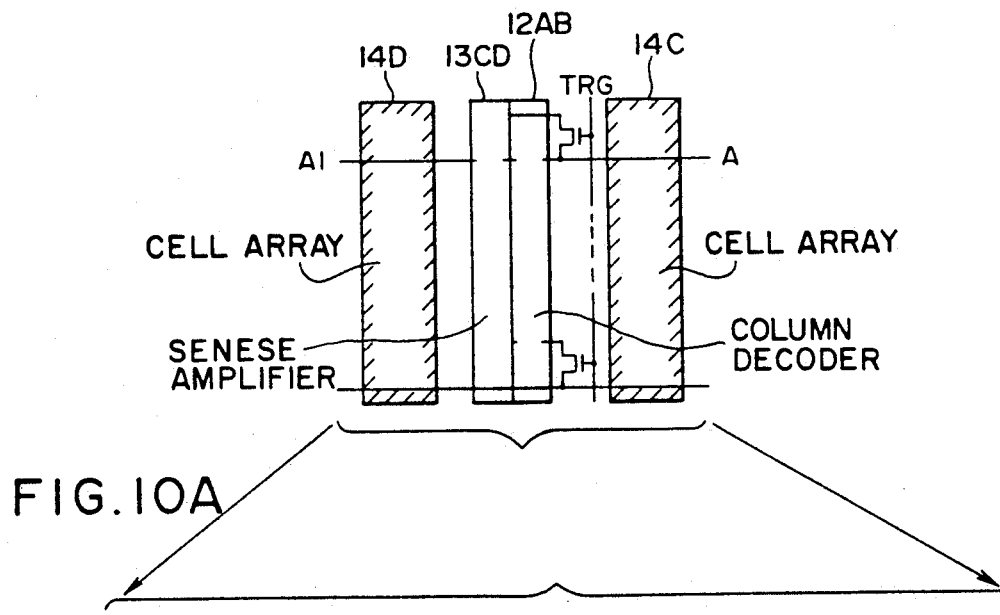
FIGS. 10A to 10C are circuit diagrams showing other embodiments of the memory device according to the present invention.
Figure 10B:
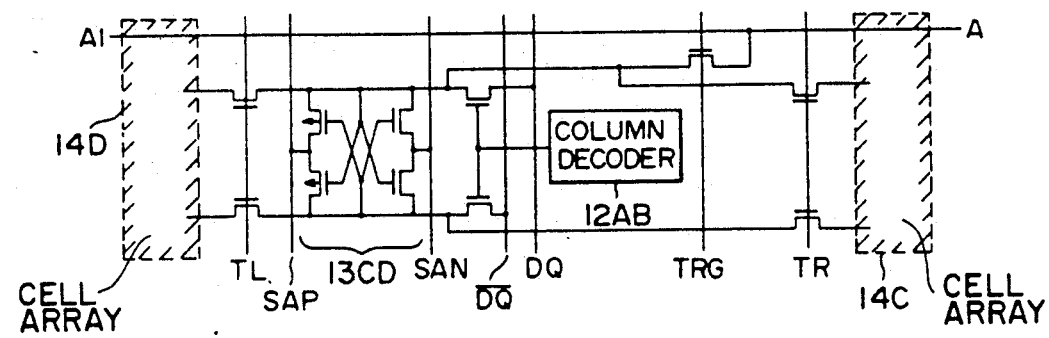
Figure 10C:
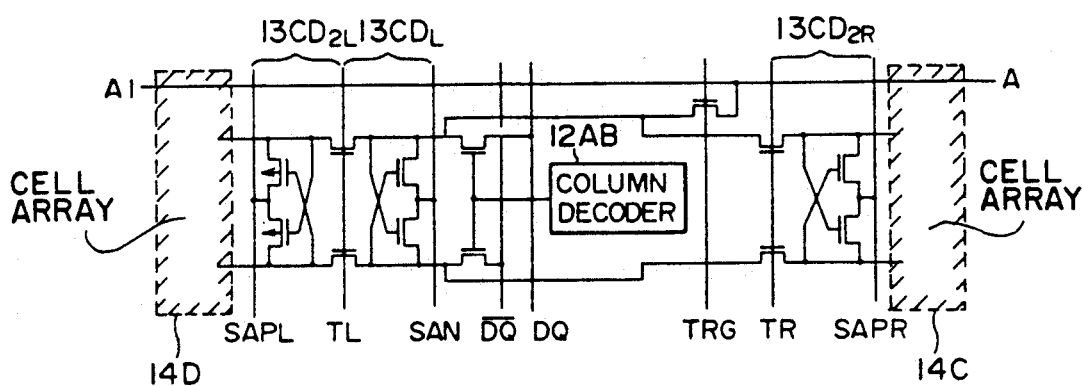

FIG. 10A shows the main circuit portion of another embodiment. This embodiment is applied to the case where each cell array is not required to extend independent data lines. Specifically, a sense amplifier 13CD is provided in common for both cell arrays 14C and 14D, to constitute one cell array section. The operation of this circuit is substantially the same as FIG. 1. FIG. 10B shows an example of the main circuit portion. In this embodiment, the sense amplifier 13CD is provided in common for both the right and left cell arrays 14C and 14D, and a sense operation is performed by opening only one of connection gates TR and TL connected to a selected one of the cell arrays 14C and 14D. FIG. 10C shows another example of the main circuit portion. In this example, only an initial sense portion 13CD1 of the sense amplifier 13CD is provided in common for both the cell arrays 14C and 14D, and its restore portions 13CD2R and 13CD2L for ensuring the high levels of bit lines are provided for each of the right and left cell arrays 14C and 14D. In both the cases shown in FIGS. 10B and 10C, only a single line of nodes A or A1 for transferring sensed data to the serial register is required, thereby reducing power consumption of a memory cell array divided type semiconductor device, and relaxing patterning pitch of the data transfer lines.

What is claimed is:

1. A memory cell array divided type multi-port memory device having random access means and serial access means, comprising:
    a plurality of cell array sections each having a plurality of memory cells disposed in a matrix form, said plurality of cell array sections being disposed in a column direction at a predetermined pitch, each said cell array section having a plurality of word lines and bit lines, said word lines being connected to said memory cells disposed in a row direction for selection of said connected memory cells, and said bit lines being connected to said memory cells disposed in a column direction for data transfer to and from said selected memory cells;
    a row decoder for activating a desired one of said word lines;
    sense amplifier means provided for each said bit line for sensing data read out to each said bit line;
    a RAM port connected to said bit lines via RAM transfer gates;
    a column decoder for selectively turn on/off said RAM transfer gates;
    a plurality of data transfer lines each having a data transfer gate at the intermediate position thereof, said data transfer lines being connected to said bit lines and formed on a layer different from layers of said word lines and bit lines;
    data transfer gate control means for turning on/off a desired one of said data transfer gates;
    a plurality of serial resisters connected to said data transfer lines;
    a serial port connected via each serial transfer gate to each said serial register; and
    a serial decoder for serially turning on/off said serial transfer gates.

2. A multi-port memory device according to claim 1, wherein random access to said cell array sections is executed asynchronously with serial access.

3. A multi-port memory device according to claim 1, wherein the number of said cell array sections is at least three.

4. A multi-port memory device according to claim 3, wherein substantially two halves of said cell array sections are disposed respectively at the right and left sides of said serial registers and said serial decoder in a column direction.

5. A multi-port memory device according to claim 1, wherein said word lines, said bit lines, and said data transfer lines, are formed on three different layers, respectively.

6. A multi-port memory device according to claim 3, wherein said word lines, said bit lines, and said data transfer lines, are formed on three different layers, respectively.

7. A multi-port memory device according to claim 4, wherein said word lines, said bit lines, and said data transfer lines, are formed on three different layers, respectively.

8. A multi-port memory device according to claim 1, wherein said sense amplifier means is provided for each said cell array section.

9. A multi-port memory device according to claim 5, wherein said sense amplifier means is provided for each said cell array section.

10. A multi-port memory device according to claim 6, wherein said sense amplifier means is provided for each said cell array section.

11. A multi-port memory device according to claim 7, wherein said sense amplifier means is provided for each said cell array section.

12. A multi-port memory device according to claim 1, wherein said sense amplifier means is provided for each said cell array sections.

13. A multi-port memory device according to claim 9, wherein an initial sense portion of said sense amplifier means is provided for each said cell array section, and one restore portion of said sense amplifier means is provided in common for the plurality of said cell array sections.

14. A multi-port memory device according to claim 1, wherein said row decoder activates a desired one of said word lines in one of said cell array sections during one access cycle.

15. A multi-port memory device according to claim 8, wherein said row decoder activates a desired one of said word lines in one of said cell array sections during one access cycle.

16. A multi-port memory device according to claim 9, wherein said row decoder activates a desired one of said word lines in one of said cell array sections during one access cycle.

17. A multi-port memory device according to claim 10, wherein said row decoder activates a desired one of said word lines in one of said cell array sections during one access cycle.

18. A multi-port memory device according to claim 11, wherein said row decoder activates a desired one of said word lines in one of said cell array sections during one access cycle.

19. A multi-port memory device according to claim 1, wherein in a data transfer cycle between said selected memory cells and said serial registers, said data transfer gate control means turns on only said data transfer gates on said data transfer lines connecting said serial registers to said bit lines in said cell array section belonging to said selected memory cells.

20. A multi-port memory device according to claim 15, wherein in a data transfer cycle between said selected memory cells and said serial registers, said data transfer gate control means turns on only said data transfer gates on said data transfer lines connecting said serial registers to said bit lines in said cell array section belonging to said selected memory cells.

21. A multi-port memory device according to clam 16, wherein in a data transfer cycle between said selected memory cells and said serial registers, said data transfer gate control means turns on only said data transfer gates on said data transfer lines connecting said serial registers to said bit lines in said cell array section belonging to said selected memory cells.

22. A multi-port memory device according to claim 17, wherein in a data transfer cycle between said selected memory cells and said serial registers, said data transfer gate control means turns on only said data transfer gates on said data transfer lines connecting said serial registers to said bit lines in said cell array section belonging to said selected memory cells.

23. A multi-port memory device according to claim 18, wherein in a data transfer cycle between said selected memory cells and said serial registers, said data transfer gate control means turns on only said data transfer gates on said data transfer lines connecting said serial registers to said bit lines in said cell array section belonging to said selected memory cells.

* * * * *